United States Patent
O'Brien

Patent Number: 5,817,182
Date of Patent: Oct. 6, 1998

[54] HYDROFLUORIC ETCH QUENCHING VIA A COLDER RINSE PROCESS

[75] Inventor: Sean C. O'Brien, Plano, Tex.

[73] Assignee: Texas Instruments Incorporated, Dallas, Tex.

[21] Appl. No.: 812,638

[22] Filed: Mar. 7, 1997

[51] Int. Cl.$^6$ .................... B08B 6/00; B44C 1/22
[52] U.S. Cl. .................... 134/1.3; 216/99; 438/756
[58] Field of Search .................... 134/1.3, 2; 216/99; 438/756, 757

[56] References Cited

U.S. PATENT DOCUMENTS 5,294,570  3/1994  Fleming, Jr. et al. .................... 437/239

Primary Examiner—R. Bruce Breneman
Assistant Examiner—George Goudreau
Attorney, Agent, or Firm—Mark A. Valetti; W. James Brady; Richard L. Donaldson

[57] ABSTRACT

One embodiment of the instant invention is a method of abruptly terminating etching of a dielectric layer on a semiconductor wafer, the method comprising the steps of: removing the semiconductor wafer from the etchant, the etchant is held a first temperature; and rinsing the semiconductor wafer in a rinse solution that is at a second temperature, the second temperature is at least 5° C. colder than the first temperature. Preferably, the dielectric layer is comprised of: TEOS, BPSG, PSG, thermally grown oxide, and any combination thereof. Preferably, first temperature is approximately 25° C. and the second temperature is approximately 0° to 5° C.; or the first temperature is approximately 70° to 90° C. and the second temperature is approximately 10° to 30° C. Preferably, the etchant is comprised of a buffered or unbuffered HF acid, and the rinse solution is comprised of deionized water. The second temperature is, preferably, at least 15° C. colder than the first temperature.

14 Claims, 1 Drawing Sheet

HYDROFLUORIC ETCH QUENCHING VIA A COLDER RINSE PROCESS

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
| --- | --- | --- |
| 08-812,659 | 3-7-97 | TI-22564 |

FIELD OF THE INVENTION

The instant invention pertains to semiconductor device fabrication and processing and more specifically to hydrofluoric etch quenching.

BACKGROUND OF THE INVENTION

The removal of $SiO_2$ films and glass films (such as PSG or BPSG) with aqueous hydrofluoric acid (HF) is a critical process throughout semiconductor device fabrication. It is essentially the first step in manufacturing, and it is typically utilized as the final cleaning step after the final metal etch step is performed. Process window characterization of HF etching is not well understood, and there are several misconceptions about the true etch rate and selectivity of such etching.

It is, therefore, an object of the instant invention to provide a process which better controls the amount of material etch in an HF etching process. More specifically, it is an object of the instant invention to provide a method of greatly reducing the amount of material (preferably $SiO_2$, BPSG, or PSG) that is etched away by the residual HF on the wafer after the semiconductor wafer is removed from the HF etching tank.

SUMMARY OF THE INVENTION

One embodiment of the instant invention is a method of abruptly terminating etching of a dielectric layer on a semiconductor wafer, the method comprising the steps of: removing the semiconductor wafer from the etchant, the etchant is held a first temperature; and rinsing the semiconductor wafer in a rinse solution that is at a second temperature, the second temperature is at least 5° C. colder than the first temperature. Preferably, the dielectric layer is comprised of: TEOS, BPSG, PSG, thermally grown oxide, and any combination thereof. Preferably, first temperature is approximately 25° C. and the second temperature is approximately 0° to 5° C.; or the first temperature is approximately 70° to 90° C. and the second temperature is approximately 10° to 30° C. Preferably, the etchant is comprised of a buffered or unbuffered HF acid, and the rinse solution is comprised of deionized water. The second temperature is, preferably, at least 15° C. colder than the first temperature.

Another embodiment of the instant invention is a method of fabricating an electrical device on a semiconductor wafer, the method comprising the steps of: subjecting the semiconductor wafer to an HF etch solution, the HF etch solution being at a first temperature; removing the semiconductor wafer from the HF etch solution; and rinsing the semiconductor wafer in a rinse solution that is at a second temperature, the second temperature being at least 20° C. colder than the first temperature so as to abruptly stop any etching by remnant HF etch solution left on the semiconductor wafer. Preferably, the first temperature is approximately 70° to 90° C. and the second temperature is approximately 10° to 30° C. Preferably, the HF etch solution is comprised of a buffered or unbuffered HF acid, and the rinse solution is comprised of deionized water.

BRIEF DESCRIPTION OF THE DRAWINGS

FIG. 1a illustrates the characteristics of etching TEOS using buffered and unbuffered 0.496% HF, FIG. 1b illustrates the characteristics of etching a thermal oxide using buffered and unbuffered 0.49% HF.

DETAILED DESCRIPTION OF THE DRAWINGS

Figure 1A:
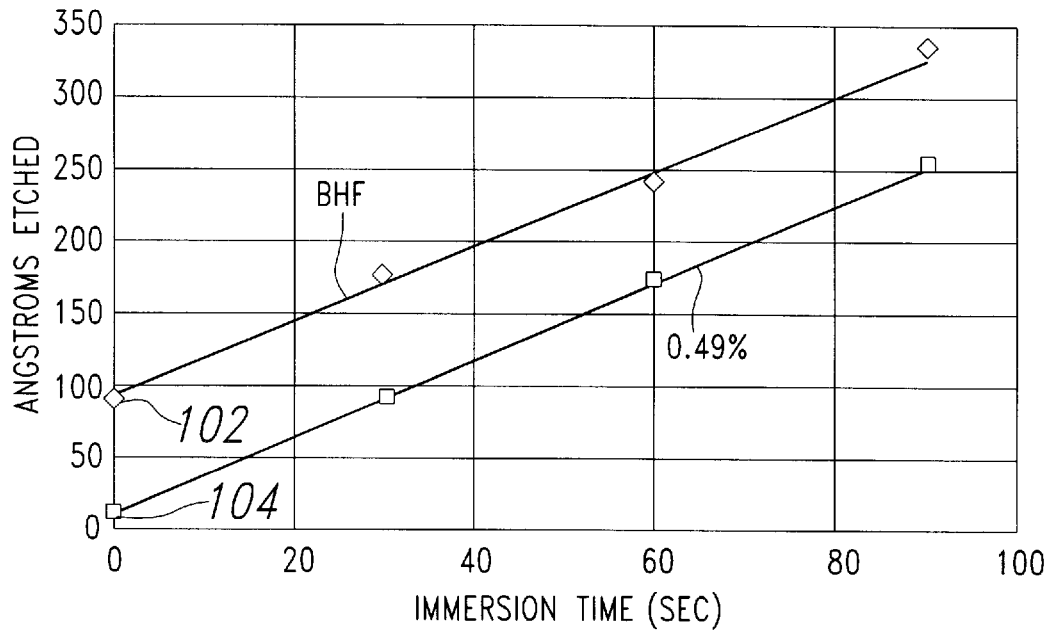
FIGS. 1a and 1b are graphs illustrating the etch rate and y-intercept of different etch processes.
Figure 1B:
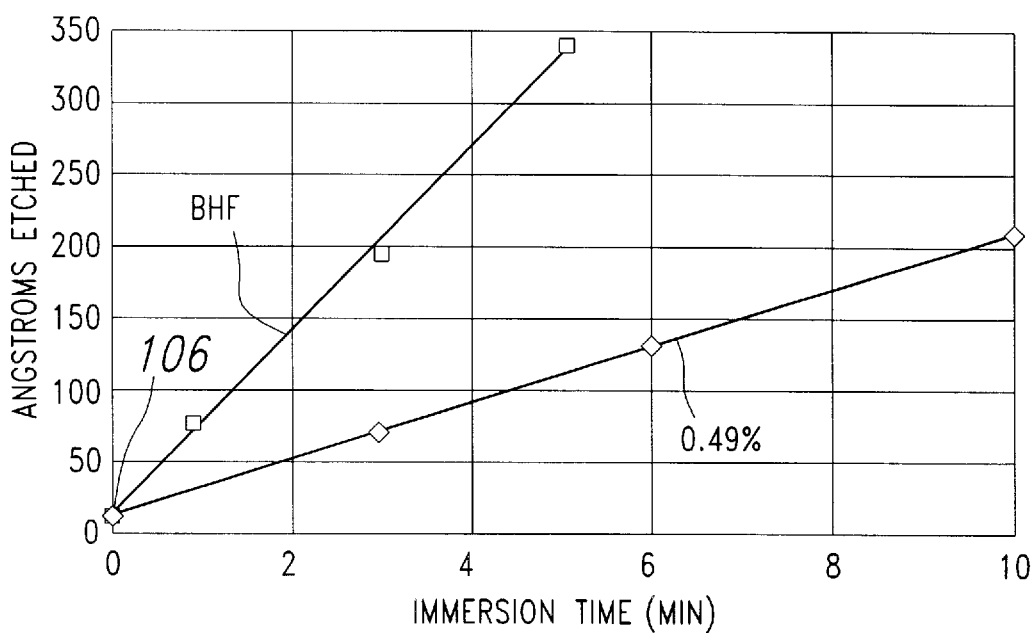

FIGS. 1a and 1b are graphs illustrating the etch rate and y-intercept of different etch processes. FIG. 1a illustrates the etching characteristics of etching TEOS using buffered and unbuffered 0.49% HF, and FIG. 1b illustrates the etching characteristics of etching a thermal oxide using buffered and unbuffered 0.49% HF. The buffered HF etchant is labeled as "BHF" in FIGS. 1a and 1b, and the unbuffered etchant is labeled "0.49" in FIGS. 1a and 1b. The buffered HF etchant is preferably approximately a 40% solution of $NH_4F$ in 0.49% HF, and the unbuffered HF etchant is preferably approximately a 0.49% HF solution.

The data for these two figures was obtained by immersing wafers in an HF tank in which the HF solution was stagnant and was held at room temperature (approximately 25° C.). Next, the wafers were transferred (which took no more than 1 second) to a rinsing tank and rinsed in deionized water (DiW) for approximately 5 minutes. During the period in which the wafers were transferred from one tank to another, a very small amount (approximately 2 to 3 Å of undensified TEOS will etch in one second) of material is etched away by residual HF etchants left on the wafer. However, as can be seen by y-intercepts 102, 104, and 106, even if the wafers were merely dipped in the HF solution and then immediately removed from the HF solution, there is some etching of the TEOS or thermal oxide films. This etching results from the increased etch rate of the residual HF left on the wafer (before these etchants are totally diffused away into the deionized water) when the wafer is initially submersed in the rinse tank.

Calculation of HF concentration is necessary for a complete chemical understanding of the process of the instant invention. The chemical reaction between $SiO_2$ and HF is unique. The chemical reaction may be written as:

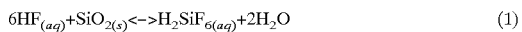

thus requiring six moles of HF to remove every mole of $SiO_2$. This is not meant to imply any reaction mechanism, only an overall complete reaction. The implicit assumption is that reaction (1) goes to completion then stops, but this is incorrect because fluosilicic acid ($H_2SiF_6$) etches silicon dioxide. The product of a complete reaction between HF and $SiO_2$ is not fluosilicic acid, it is decafluodisilicic acid produced through the reaction:

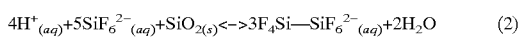

Thus the overall reaction between HF and $SiO_2$ really requires only a 5:1 molar ratio:

Upon completion of (1) the $H_2SiF_6$ product is located within a few angstroms of the wafer surface. Steric hindrance and rotational alignment should prevent immediate reaction with surface $SiO_2$. Thus, isolation of reaction (1) may be impossible, it may even be rate limiting. The rate of (2) may be much higher and dominate the overall etch rate and etch dynamics.

Two principle components that affect the etch rate of $SiO_2$ films are: microscopic chemical reactions and diffusion of both reactants and products. Once the chemical reaction products are formed they will preferably be diffused away from the wafer surface, otherwise reaction (3) would stop upon saturation of the boundary layer at the wafer surface. For example, a 5 $\mu$m thick layer of 0.49% HF could etch 59 Å of $SiO_2$ ($\rho$=2.5 g/cm$^3$) before totally depleting the reactants. Diffusion of reactants into the boundary layer is preferable so as to etch more than this thickness ratio of 850:1 (boundary layer to etch delta).

The true measured etch rate is the rate at which $SiO_2$ diffuses a large distance from the wafer. This diffusion rate may not depend on the microscopic chemical reaction rate of HF and $SiO_2$. The diffusion rate is proportional to the concentration gradient, which is determined by the concentration of the product of $HF_x$ and $SiF_x$ species (since the boundary layer thickness is constant). If diffusion is rate limiting (the chemical reaction is much faster than diffusion) then the boundary layer quickly to saturates, products diffuse away from and reactants diffuse towards, the wafers. Increasing the reactant $HF_x$ species will increase the concentration in the boundary layer thus leading to a faster diffusion rate and net etch rate. Thus, increasing the HF concentration will increase the observed etch rate even in a purely diffusion limited process.

Most likely, the most prevalent mechanism of $SiO_2$ etching involves the $HF_2^-$ species. This is primarily due to the fact that the addition of an $NH_4F$ buffer to the HF solution will accelerate the etch rate of a thermally grown oxide. Because buffering only marginally impacts the etch rate of deposited films, a different etching mechanism seems to apply. Thus, by increasing the concentration of the primary reactant species, $HF_2^-$, the selectivity amongst various films can be tuned to a precise value.

As seen in FIG. 1a, the removal of TEOS in BHF (buffered HF solution) is extremely linear with time, but the value of y-intercept (point 102) is quite large. Conceptually this intercept results from etching which occurs during the transfer from the BHF process tank to the water rinse tank and the subsequent rinse. A thin film of etchant remains on the hydrophilic wafer and it continues to react until diluted to pure water.

FIG. 1a shows the etch curves for TEOS. The $NH_4F$ buffering agent does not change the etch rate, only the zero time intercept is affected. Slight differences in slope as measured are well within experimental error. FIG. 1b shows that the exact opposite behavior is found for thermal oxide films, where only the etch rate changes.

The etch rates of thermal oxide and TEOS films are very similar. Both increase by approximately a factor of five as the $NH_4F$ increases from 0 to 13%, then decrease to a value about twice that of unbuffered HF. The difference between etch rates of a TEOS film that is reflowed at one or two different temperatures in 0% and 40% solutions is nearly a factor of two. In contrast, the difference in etch rates with regards to 0% and 40% solutions for undensified TEOS is minimal (144 Å/min versus 159 Å/min). A reduction of etch rate with thermal processing indicates the film is approaching thermal oxide density and bonding configuration. Further high temperature annealing should reduce the etch rate even further.

The etch rate of BPSG does not depend on $NH_4F$ concentration (below 15%). In addition, the etch rates are well below those reported for 1% HF, due to the sharp dependence of BPSG etch rates on HF concentration.

There are several process issues associated with rinsing HF from wafers. The primary reason for the rinse is to quench the etch, to quickly stop $SiO_2$ removal in a uniform and controlled manner resulting in an etch of exactly a certain number of angstroms. Other process issues include particles, and acid residue which may impact subsequent processing, device yield, or reliability. One important non-process issue is safety. HF is dangerous, and therefore should preferably be removed from both the wafer and cassette quickly and efficiently.

Submersion of a wafer after HF processing can be utilized so as to remove the HF from the wafer. The amount of rinse water required (and therefore cost) can be reduced with partitioned processes. Hence, wafers should be immersed in nearly stagnant water, which will quench the etch while using a minimal amount of water. Then, after dilution is complete, the flow velocity can be increased to drop the HF concentration to zero. Water usage can be optimized by separating the quench process from the dilution process.

The large zero-time etch value (y-intercept value) in highly buffered solutions results from the fact that the etch rate of the HF is dramatically increased when the residual HF is first subjected to the rinse water. Thus, the oxide film will continue to be etched despite the dilution of acid, and it will actually be etched faster than at the beginning. It is only after the $NH_4F$ concentration has decreased below approximately 13% that the etch rate begins to decrease towards zero. Thus, the standard process of rinsing concentrated buffered HF off of wafers actually etches them.

The process of the instant invention greatly reduces the amount of dielectric (preferably TEOS or $SiO_2$) that is etched by any residual HF left on the wafer after the wafer is removed from the HF tank. In one embodiment of the instant invention, a wafer would be removed from an HF tank (which would preferably have a temperature ranging from approximately 70° to 90° C.) and placed in a rinse tank (preferably comprising deionized water) which is at least 15° C. colder than the HF tank. Preferably, if the HF tank is at a temperature of between 70° to 90° C. then the rinse would preferably be at a temperature between 0° and 30° C. However, the solution in the HF tank may be held around room temperature and the solution in the rinse tank may be cooled such that it is 20° C. colder than the solution in the HF tank.

Another embodiment of the instant invention involves removing the wafer from an HF tank and quenching the etching effect of residual HF etchant on the wafer by immersing the wafer in a solvent which complexes the residual HF (or buffered HF) or the oxide which is etched and changes the etch rate of the residual HF. Thereby, once the solvent is diluted away in a later rinse, the HF solution is already diluted away. Preferably, the solvent is comprised of an alcohol or an amine. More preferably, the solvent is comprised of: isopropanol, acetone, acetic acid, or $NH_4OH$. In another embodiment of the instant invention, the solvent is held at a temperature colder than the HF (or buffered HF) solution. Preferably, the solvent would be at least 20° C. colder than the HF solution.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of abruptly terminating etching of a dielectric layer on a semiconductor wafer, said method comprising the steps of:

removing said semiconductor wafer from the etchant, said etchant is held a first temperature;

rinsing said semiconductor wafer in a rinse solution that is at a second temperature, said second temperature is at least 5° C. colder than said first temperature;

and wherein said etchant etches at least 20 Angstroms of said dielectric layer per minute during the prior etch step.

2. The method of claim 1, wherein said dielectric layer is comprised of a material selected from a group consisting of: TEOS, BPSG, PSG, thermally grown oxide, and any combination thereof.

3. The method of claim 1, wherein said first temperature is 25° C.

4. The method of claim 3, wherein said second temperature is 0° to 5° C.

5. The method of claim 1, wherein said first temperature is 70° to 90° C.

6. The method of claim 5, wherein said second temperature is 10° to 30° C.

7. The method of claim 1, wherein said etchant is comprised of a buffered or unbuffered HF acid.

8. The method of claim 1, wherein said rinse solution is comprised of deionized water.

9. The method of claim 1, wherein said second temperature is at least 15° C. colder than said first temperature.

10. A method of fabricating an electrical device on a semiconductor wafer, said method comprising the steps of:

subjecting said semiconductor wafer to an HF etch solution, said HF etch solution being at a first temperature and etching at least 20 Angstroms of a dielectric layer formed over said semiconductor wafer per minute;

removing said semiconductor wafer from said HF etch solution; and rinsing said semiconductor wafer in a rinse solution that is at a second temperature, said second temperature being at least 20° C. colder than said first temperature so as to abruptly stop any etching by remnant HF etch solution left on said semiconductor wafer.

11. The method of claim 10, wherein said first temperature is 70° to 90° C.

12. The method of claim 11, wherein said second temperature is 10° to 30° C.

13. The method of claim 10, wherein said HF etch solution is comprised of a buffered or unbuffered HF acid.

14. The method of claim 10, wherein said rinse solution is comprised of deionized water.

* * * * *